(12) United States Patent
Shoemaker et al.

(10) Patent No.: US 10,649,112 B2
(45) Date of Patent: May 12, 2020

(54) TAPE FORMAT MAGNETOELASTIC RESONATOR MARKERS

(71) Applicant: 3M INNOVATIVE PROPERTIES COMPANY, St. Paul, MN (US)

(72) Inventors: Curtis L. Shoemaker, Round Rock, TX (US); Ziyad H. Doany, Austin, TX (US); Ding Wang, Austin, TX (US)

(*) Notice: Subject to any disclaimer, the term of this patent is extended or adjusted under 35 U.S.C. 154(b) by 0 days.

(21) Appl. No.: 16/066,254

(22) PCT Filed: Dec. 15, 2016

(86) PCT No.: PCT/US2016/066871
§ 371 (c)(1),
(2) Date: Jun. 26, 2018

(87) PCT Pub. No.: WO2017/116736
PCT Pub. Date: Jul. 6, 2017

(65) Prior Publication Data
US 2019/0011599 A1  Jan. 10, 2019

Related U.S. Application Data

(60) Provisional application No. 62/272,787, filed on Dec. 30, 2015.

(51) Int. Cl.
*G06K 19/06* (2006.01)
*G01V 15/00* (2006.01)
(Continued)

(52) U.S. Cl.
CPC ............. *G01V 15/00* (2013.01); *G01R 33/02* (2013.01); *G01R 33/063* (2013.01); *G01R 33/18* (2013.01);
(Continued)

(58) Field of Classification Search
CPC ...... G01V 15/00; G01R 33/02; G01R 33/063; G01R 33/18; H01F 1/04; H01F 1/15308; H01F 1/15333; H03H 9/24; G06K 19/06196
USPC ......................................... 235/493, 487, 449
See application file for complete search history.

(56) References Cited

U.S. PATENT DOCUMENTS 3,406,302 A  10/1968  Lanyi
5,532,598 A  7/1996  Clark, Jr. et al.
(Continued)

FOREIGN PATENT DOCUMENTS

CN  1468439 A  1/2004
CN  1885446 A  12/2006
(Continued)

OTHER PUBLICATIONS

International Search report for PCT International Application No. PCT/US2016/066871 dated Apr. 3, 2017, 4 pages.

*Primary Examiner* — Karl D Frech
(74) *Attorney, Agent, or Firm* — Gregg H. Rosenblatt

(57) ABSTRACT

A tape format magnetoelastic resonator device comprises a continuous ribbon of amorphous magnetic material having a plurality of separate, hinged magnetoelastic resonator strips formed from the ribbon, linearly displaced along a longitudinal axis of the ribbon, wherein each magnetoelastic resonator strip is configured to couple to an external magnetic field at a particular frequency and convert the magnetic energy into mechanical energy, in the form of oscillations.

11 Claims, 4 Drawing Sheets

(51) Int. Cl.
   *G01R 33/18* (2006.01)
   *G01R 33/06* (2006.01)
   *G01R 33/02* (2006.01)
   *H01F 1/04* (2006.01)
   *H03H 9/24* (2006.01)
   *H01F 1/153* (2006.01)
   *H01F 27/25* (2006.01)

(52) U.S. Cl.
   CPC ......... *G06K 19/06196* (2013.01); *H01F 1/04* (2013.01); *H03H 9/24* (2013.01); *H01F 1/15308* (2013.01); *H01F 1/15333* (2013.01); *H01F 27/25* (2013.01)

(56) References Cited

U.S. PATENT DOCUMENTS

| | | |
|---|---|---|
| 8,354,842 B2 | 1/2013 | Kim |
| 2004/0014201 A1 | 1/2004 | Kim |
| 2005/0242956 A1* | 11/2005 | Sorkine .................. G01V 15/00 340/572.6 |
| 2008/0131545 A1 | 6/2008 | Peter |
| 2008/0136571 A1 | 6/2008 | Peter et al. |
| 2010/0109670 A1 | 5/2010 | Arnaud et al. |
| 2010/0328136 A1 | 12/2010 | Burd |
| 2012/0068823 A1 | 3/2012 | Doany |
| 2012/0325359 A1 | 12/2012 | Doany |
| 2013/0099790 A1 | 4/2013 | Doany |
| 2015/0226872 A1 | 8/2015 | Doany |
| 2015/0356842 A1 | 12/2015 | Zirk et al. |

FOREIGN PATENT DOCUMENTS

| | | |
|---|---|---|
| CN | 101460837 A | 6/2009 |
| RU | 2393830 C2 | 12/2005 |
| RU | 2316610 C2 | 2/2008 |
| WO | WO 2015-112875 | 7/2015 |
| WO | WO 2015-191396 | 12/2015 |
| WO | WO 2016-182815 | 11/2016 |

* cited by examiner

TAPE FORMAT MAGNETOELASTIC RESONATOR MARKERS

BACKGROUND

Magneto-mechanical resonators (MMRs), also referred to as magnetoelastic (MEL) resonators, are well known and have been used in retail security applications for decades. In addition, MEL resonators are also suitable for buried infrastructure due to their low cost, low profile and flexible components. They can be configured as stand-alone markers or physically attached to an underground pipe or utility. They can be used to identify a buried asset and its location accurately. For example, see US 2012/068823; US 2012/0325359; and US 2013/0099790, each of which is incorporated herein by reference in its entirety.

However, the detection range and frequency stability of such conventional MEL resonators can be limited.

SUMMARY OF THE INVENTION

In a first aspect of the invention, a tape format magnetoelastic resonator device comprises a continuous ribbon of amorphous magnetic material having a plurality of separate, hinged magnetoelastic resonator strips formed from the ribbon, linearly displaced along a longitudinal axis of the ribbon, wherein each magnetoelastic resonator strip is configured to couple to an external magnetic field at a particular frequency and convert the magnetic energy into mechanical energy, in the form of oscillations.

In another aspect, a tape format magnetoelastic (MEL) resonator device comprises a tape or ribbon formed from an amorphous magnetic material having a longitudinal axis. A first section of the tape includes a first slot configured to receive a first bias magnet. A second section of the tape, adjacent to the first section along the longitudinal axis, comprises a first magnetoelastic resonator strip having first and second free ends and a central portion, the central portion connected to the tape via a hinge. A third section of the tape, adjacent to the second section along the longitudinal axis, includes a second slot configured to receive a second bias magnet.

In another aspect, the tape format magnetoelastic resonator device further comprises a fourth section of the tape, adjacent to the third section along the longitudinal axis, comprising a second magnetoelastic resonator strip having first and second free ends and a central portion, the central portion connected to the tape via a hinge, and a fifth section of the tape, adjacent to the fourth section along the longitudinal axis, including a third slot configured to receive a third bias magnet.

In another aspect, the first magnetoelastic resonator strip can comprise one of a substantially rectangular shape or substantially elliptical shape.

In another aspect, any of the preceding tape format magnetoelastic resonator devices can be attached to an asset buried underground.

In another aspect, any of the preceding tape format magnetoelastic resonator devices can further comprise sprocket holes formed along the lengthwise edges of the tape.

In another aspect, the hinge is formed as one or more narrow strips extending from the central portion of the resonator strip towards the outer edges of the tape or ribbon.

In another aspect, the hinge geometry is configured to decrease the effect of loading due to the Poisson contraction.

In another aspect, the tape format magnetoelastic resonator device has a frequency range of from about 34 kHz to about 80 kHz.

In another aspect, the tape format magnetoelastic resonator device can be detected at a depth up to about 48 inches underground.

In another aspect, a system comprises any of the preceding tape format magnetoelastic resonator devices and a portable locating device.

In another aspect, the tape format magnetoelastic resonator device comprises two or more layers that are layered in such a way as to register individual resonators into a stacked resonator arrangement at each location along the array. In another aspect, a patterned polymer layer is inserted between each layer of resonator strips, serving to provide a spacing of the resonators at the nodal location of each resonator.

The above summary of the present invention is not intended to describe each illustrated embodiment or every implementation of the present invention. The figures and the detailed description that follows more particularly exemplify these embodiments.

BRIEF DESCRIPTION OF THE DRAWINGS

The invention will be described hereinafter in part by reference to non-limiting examples thereof and with reference to the drawings, in which.

Figure 1:
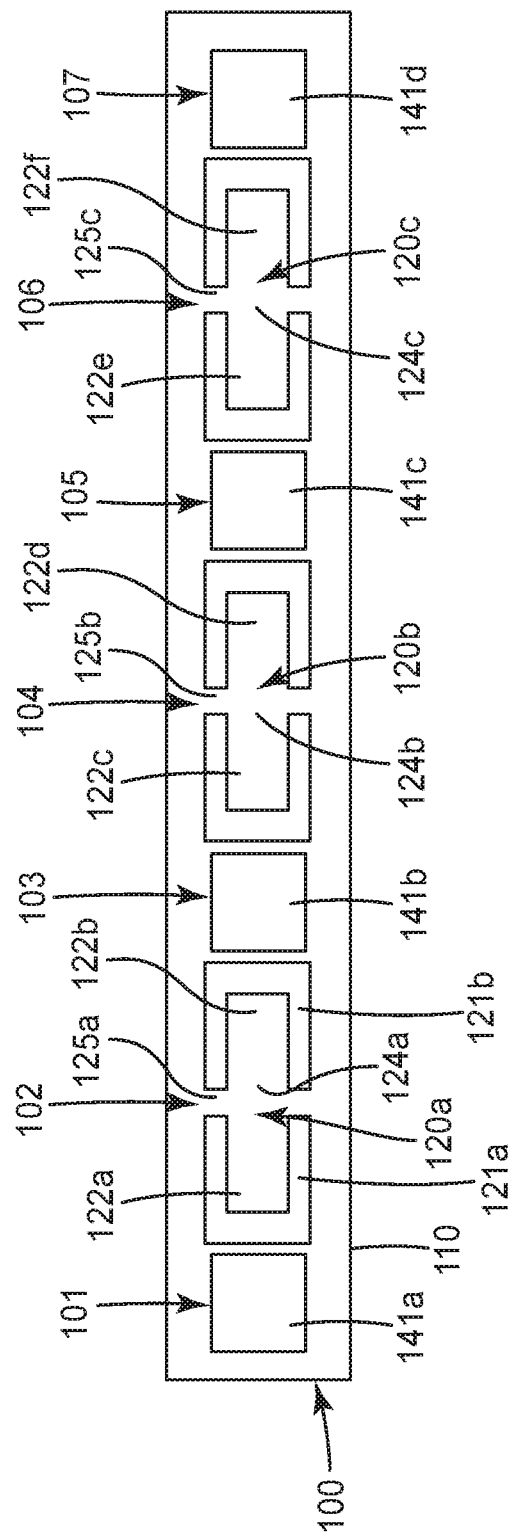
FIG. 1 is a top view of a tape format magnetoelastic resonator device according to a first aspect of the invention.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the scope of the invention as defined by the appended claims.

DETAILED DESCRIPTION OF EMBODIMENTS

In the following description, reference is made to the accompanying drawings, which form a part hereof, and in which is shown by way of illustration specific embodiments in which the invention may be practiced. In this regard, directional terminology, such as "top," "bottom," "front," "back," "leading," "forward," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

A tape format magnetoelastic (MEL) resonator device comprises a continuous ribbon of amorphous magnetic material having a plurality of separate, hinged magnetoelastic resonator strips formed from the ribbon, linearly displaced along a longitudinal axis of the ribbon, where each magnetoelastic resonator strip is configured to couple to an external magnetic field at a particular frequency and convert the magnetic energy into mechanical energy, in the form of oscillations. The individual resonators are attached at the edges of the nodal point in such a way as to minimize the load on the resonator from the transverse ("Poisson contraction") motion as the longitudinal resonance is excited. The tape itself acts as both a carrier, allowing for reel-to-reel manufacturing, and as a "magnetic armature". The product can be made in a laser machining operation, patterning the continuous strip of resonators and "hinges" in the process. This format enables manufacturing in reel-to-reel format, stacking of tapes for stacked and linear arrays, and for batch oven annealing, with no longitudinal stress on the resonators during thermal annealing. Such a device can be utilized as a MEL resonator marker, suitable for marking and locating buried infrastructure due to its low cost, low profile and flexible components. The MEL markers described herein can provide frequency tunability, high frequency stability, high energy storage, and a low profile, all in combination with extended detection range. The MEL marker can be a stand-alone marker, it can be physically attached to an underground asset, such as a pipe or other utility, or it can be attached to another device or carrier, such as caution or warning tape, located at or near the underground asset.

FIG. 1 shows a first aspect of the invention, a tape or ribbon format magnetoelastic (MEL) resonator device 100. The resonator device 100 includes an array of magnetoelastic resonator strips 120*a*, 120*b*, 120*c*, etc. formed from a substrate comprising a continuous tape or ribbon of amorphous magnetic material 110. A processing or machining operation (as described further below) can be used to create an array of magnetoelastic resonator elements from the ribbon or tape 110 that extends along the longitudinal axis thereof.

Each of the resonator elements includes a resonator strip 120, such as resonator strip 120*a*, and a pair of magnetic bias elements disposed at each end of the resonator strip. In particular, a first section 101 of the tape 110 includes a first slot 141*a* configured to receive a first bias magnet (not shown). A second section 102 of the tape 110 is adjacent to the first section 101 along the longitudinal axis and comprises a first magnetoelastic resonator strip 120*a* having first and second free ends 122*a*, 122*b* and a central portion 124*a* connected to the tape 110 via a hinge, here first and second hinges 125*a*. The resonator strip is formed by removing portions 121*a* and 121*b* of the ribbon or tape to form shaped cavities in the ribbon or tape 110. This removal can be accomplished via a (laser or EDM) machining process, stamping process, or by a chemical patterning and etch process. The shape of removed portions 121*a* and 121*b* can also be configured to form a particular hinge shape. A third section 103 of the tape 110 is disposed adjacent to the second section 102 along the longitudinal axis and includes a second slot 141*b* configured to receive a second bias magnet (not shown). As such, resonator strip 120*a* is disposed between bias magnet slots 141*a* and 141*b*. As described herein, when bias magnets are inserted in the slots, the resonator strip 120*a* will be able to couple to an external magnetic field at a particular frequency and convert the magnetic energy into mechanical energy, in the form of oscillations.

A fourth section 104 of the tape 110, adjacent to the third section 103 along the longitudinal axis comprises a second magnetoelastic resonator strip 120*b* having first and second free ends 122*c*, 122*d* and a central portion 124*b*, the central portion connected to the tape 110 via hinge(s) 125*b*. A fifth section 105 of the tape 110, adjacent to the fourth section 104 along the longitudinal axis, includes a third slot 141*c* configured to receive a third bias magnet (not shown). In this construction, resonator strips 125*a* and 125*b* would share a common bias magnet located in slot 141*b*. As would be understood, multiple additional sections and resonator elements can be formed along the length of the ribbon 110. It should be noted that while tape or ribbon 110 is described as being continuous, this is not meant to mean that the tape is of infinite length, rather the tape length can be of substantial length such that it can be processed as part of a reel-to-reel manufacturing operation. Moreover, the present description is not intended to exclude embodiments where individual magnetoelastic resonators can be singulated from the tape or ribbon 110.

In particular, the ribbon or tape 110 can comprise a magnetoelastic material with magnetostrictive properties, such as a magnetic amorphous alloy or crystalline material such as Metglas 2826 MB, 2605SA1 or 2605S3A made by Metglas, Inc. of Conway, S.C. Other suitable materials are available from Vacuumschmelze GmbH of Hanau, Germany. The physical dimensions, such as the length and width of the resonator strip(s) 120*a*, 120*b*, 120*c*, etc., can be chosen based on the desired response frequency. The ribbons may be annealed or non-annealed. In some aspects, each of the magnetoelastic resonator strips 120*a*, 120*b*, 120*c*, etc., can comprise a substantially rectangular or substantially elliptical shape, having a major axis length of about 25 mm to 40 mm. In another aspect, each of the MEL elements comprises a metal strip having a major axis length of about 40 mm to 65 mm. By "substantially" rectangular or "substantially" elliptical, it is meant that the resonator strip shape does not have to be a perfect rectangle (e.g., the strip may have rounded corners) or ellipse.

Bias magnetic elements (bias magnets) can each comprise a permanent magnet or a magnetically hard or semi-hard metal strip. The magnetic axes of the bias magnets are set in the same general direction along the ribbon long axis. A magnetically hard magnetic bias material that is not readily changeable can be utilized herein because its bias characteristics are unlikely to change when buried underground. The magnetic bias element can be made from any magnetic material that has sufficient magnetic remanence when magnetized to appropriately bias the resonators, and sufficient magnetic coercivity so as to not be magnetically altered in normal operating environments. A commercially available magnetic material such as Arnokrome™ III from The Arnold Engineering Company of Marengo, Ill., can be utilized, though other materials could serve equally well. For example, in one particular aspect, the dimensions of the bias magnets (Neodymium magnets available from K&J Magnetics Inc.) can be about 1/16" (thickness), 1/8" (height), and 1/4" (width) with magnetization through the thickness. Of course, bias magnet dimensions can vary based on resonator element size and width. As with linear or bar magnets, the magnetic bias elements can each have magnetic poles, one at each end.

Figure 2A:
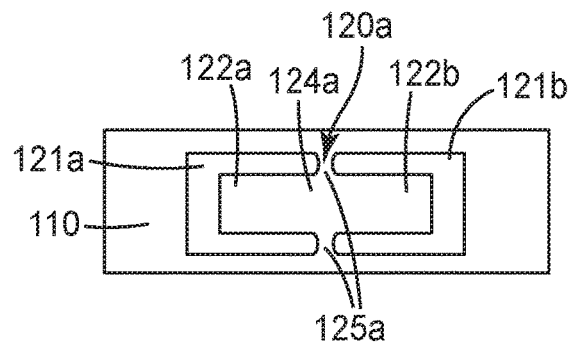
FIGS. 2A-2F are close up top views of different magnetoelastic resonator strips formed from the tape or ribbon according to alternative aspects of the invention.

The magnetoelastic resonator strips 120 can have a variety of shapes, including a substantially rectangular or substantially elliptical shape. For example, FIGS. 2A-2F show several alternative constructions. In FIG. 2A, a magnetoelastic resonator strip 120a is formed by removing portions 121a and 121b from ribbon or tape 110. In this example, the shape of removed portions 121a, 121b creates a substantially rectangular resonator strip shape 120a. The hinges 125a are formed as relatively narrow strips extending from the central portion 124a towards the outer edges of the tape or ribbon 110.

Figure 2B:
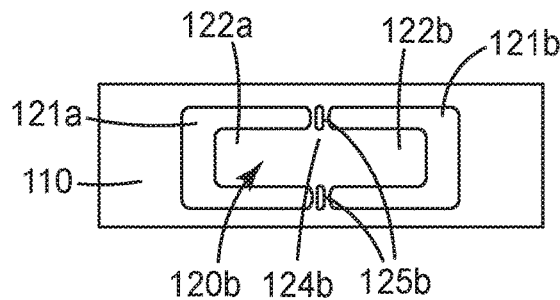

In another alternative construction, in FIG. 2B, a magnetoelastic resonator strip 120b is formed by removing portions 121a and 121b from ribbon or tape 110. In this example, the shape of removed portions 121a, 121b creates a substantially rectangular resonator strip shape 120b, but with rounded edges at strip ends 122a, 122b. The hinges 125b are formed as multiple narrow strips extending from the central portion 124a towards the outer edges of the tape or ribbon 110.

Figure 2C:
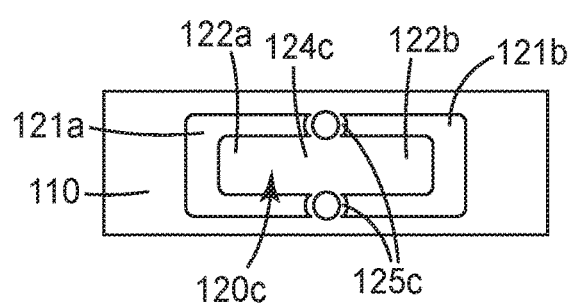

In another alternative construction, in FIG. 2C, a magnetoelastic resonator strip 120c is formed by removing portions 121a and 121b from ribbon or tape 110. In this example, the shape of removed portions 121a, 121b creates a substantially rectangular resonator strip shape 120c, but with rounded edges at strip ends 122a, 122b. The hinges 125c are formed as multiple narrow strips extending from the central portion 124a towards the outer edges of the tape or ribbon 110 by removing circular portions of the ribbon 110 at the hinge region.

Figure 2D:
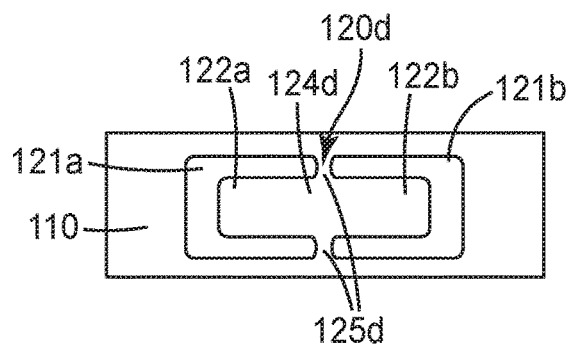

In another alternative construction, in FIG. 2D, a magnetoelastic resonator strip 120d is formed by removing portions 121a and 121b from ribbon or tape 110. In this example, the shape of removed portions 121a, 121b creates a substantially rectangular resonator strip shape 120b, but with rounded edges at strip ends 122a, 122b. The hinges 125d are formed as a narrow strip extending from the central portion 124a towards the outer edges of the tape or ribbon 110.

Figure 2E:
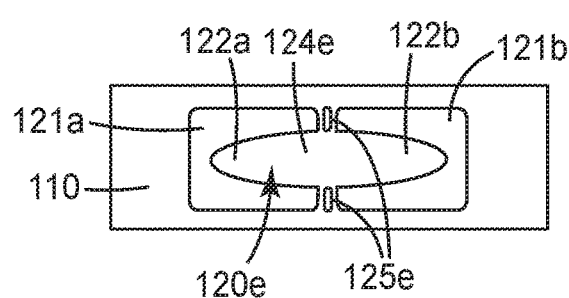

In another alternative construction, in FIG. 2E, a magnetoelastic resonator strip 120e is formed by removing portions 121a and 121b from ribbon or tape 110. In this example, the shape of removed portions 121a, 121b creates a substantially elliptical resonator strip shape 120c, with curved edges at strip ends 122a, 122b. As has been determined by the investigators, signal gain can be improved by using an elliptically-shaped resonator device. The hinges 125e are formed as multiple narrow strips extending from the central portion 124a towards the outer edges of the tape or ribbon 110.

Figure 2F:
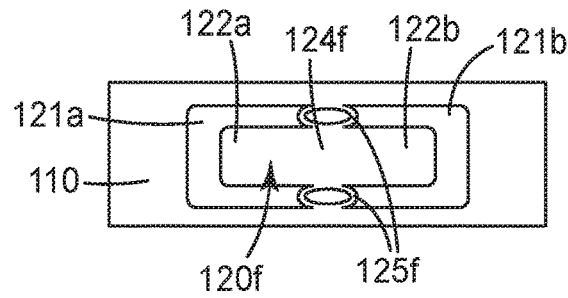

In yet another alternative construction, in FIG. 2F, a magnetoelastic resonator strip 120f is formed by removing portions 121a and 121b from ribbon or tape 110. In this example, the shape of removed portions 121a, 121b creates a substantially rectangular resonator strip shape 120f, but with rounded edges at strip ends 122a, 122b. The hinges 125f are formed as multiple curved narrow strips extending from the central portion 124a towards the outer edges of the tape or ribbon 110 by removing elliptically shaped portions of the ribbon at the hinge region.

The above examples are not meant to be limiting as to the resonator strip shape or hinge configuration. As would be understood by one of skill in the art given the present description, the strip shape or hinge shape can be modified such that a suitable resonator can include, for example, the resonator strip shape of FIG. 2E and the hinge configuration of FIG. 2F.

In operation, as mentioned above, the magnetoelastic resonator device can be employed as part of a robust MEL marker system configured for buried environments, where the marker device resonates at its characteristic frequency when interrogated (using e.g., a portable locator) with an alternating magnetic field tuned to this frequency. Energy is stored in the marker during this interrogation period in the form of both magnetic and mechanical energy (manifested as resonator vibrations). When the interrogation field is removed, the resonator continues to vibrate and releases significant alternating magneto-mechanical energy at its resonant frequency that can be remotely sensed with a suitable detector, which can be incorporated within the same portable locator. Thus, the marker device can be located by exciting it with an external alternating magnetic field where energy is stored in the marker, and then detecting the magnetic field generated by the marker device as it dissipates its stored energy through exponential decay, at its own resonant frequency. Such a response alerts a locating technician to the presence of the marker device.

Referring back to FIG. 1, a single tape format array device 100 is shown. In general, MEL resonator-based sensors can benefit from the gain due to array formats, in order to have greater detection range, or the ability to handle higher sensor loads. While only one tape format array is shown in FIG. 1, in another aspect of the invention, a resonator device can be formed by combining a series of tape format resonator arrays (TAFR) that are registered and stacked. As described further below, the devices can be manufactured using an in-line manufacturing process. Alternatively, as would be understood by one of skill in the art given the present description, a similar approach can be used to create "clusters" of tags or individual stacked arrays by singulating the stacked ribbons in a second operation.

In another aspect, the tape array format itself can provide a low-profile flexible array for the use on buried infrastructure, such as a pipe, where the flexible format of the tape array allows it to be utilized on smaller diameter (e.g., less than 4") coiled pipes, as well as pipes of any diameter in stick format. The flexible format of the resonator array would allow the plastic pipe to be wound up on large reels.

In another aspect, the tape format magnetoelastic resonator device can further include a housing or cover configured to enclose the device. The housing 210 can be formed from a plastic or any other non-conductive material, such as PVC, or other polymers. In one aspect, the housing can be formed using a conventional vacuum forming process. In a preferred aspect, the housing material can maintain its shape and spacing around the resonator strip and bias material. In addition, the housing and component material can be formed as a non-rigid or flexible structure (e.g., it can be corrugated), either as a result of material composition or thickness of the housing walls. Also, the housing can have a low profile. For example, a corrugated housing can provide higher strength than a flat housing and can flex, making the product suitable for direct bury applications and on plastic pipe applications.

In an alternative aspect of the invention, the MEL resonator devices described herein can be placed within a protective capsule or outer housing designed to withstand rugged conditions. The protective capsule can be formed from a rugged material such as high density polyethylene (HDPE).

Referring back to the alternative resonator strip and hinge aspects of FIGS. 2A-2F, as has been determined by the investigators, the design of FIG. 2A oscillates suitably, but shows a nominal 0.7 dB decrease in gain due to the "Poisson contraction." That is, when the resonator oscillates in the longitudinal direction, it exhibits the opposite motion in the transverse direction due to conservation of material volume (e.g, if the sample elongates in the longitudinal direction, it will contract in the transverse direction, and vice versa). While the array format provides a significant gain increase, mitigating the effect of the Poisson contraction, the "hinge" geometry can be optimized to decrease the effect of the loading due to the Poisson contraction and thereby achieve maximum gain. The loss of 0.7 dB assumes that the "rail" of the tape format is not rigidly anchored at the hinge location itself (described further below).

For FIG. 2D, resonator strip 120d has a similar design to resonator strip 120a, but with rounded corners on resonator and cavity. In general, rounded corners can produce more consistent results from resonator to resonator, with a substantially elliptical shape (see e.g., FIG. 2E).

In FIG. 2B, the hinge design of FIG. 2A has been modified to reduce the amount of material that is loading the Poisson contraction of the resonator. The lesser material can provide a "weaker spring." A hinge design such as shown in FIG. 2B, and that of FIGS. 2C, 2E, and 2F can utilize laser machining, and with a process that is developed to put minimal heat into the substrate (tape or ribbon 110). The "hinge" that will load the resonator to a lesser extent is a smaller, more compliant structure. That small structure should not be heated to the point of crystallization of the metal. A crystallized hinge may fail mechanically in the manufacturing process, handling, or deployment/use of the product.

In addition, the hinge design of FIG. 2F can produce lower loading than the other hinge designs shown in FIGS. 2A-2E, while other geometries are possible, as would be understood by one of skill in the art given the present description. It is noted that the hinge design of FIG. 2F has some "stress concentration" areas with sharp internal corners.

It is also noted that for the magnetoelastic resonator strip design of FIG. 2A, when the lateral edge areas of the ribbon or tape 110 at the hinge region are rigidly affixed to a sample platen, the resonator oscillations can be greatly diminished. In practical terms, this means that the ribbon "rails" are flexing slightly and act as part of the hinge itself. As such, further hinge designs can be employed which provide more isolation of the hinge and rails. In addition, for marker packaging uses, depending on the hinge effectiveness, the "rails" may not be attached to the package assembly rigidly in the vicinity of the nodal point, allowing for some level of compliance of the rails themselves.

As mentioned above, ribbon or tape 110 comprises an amorphous magnetic material. In practice, this material may be annealed or non-annealed. As the investigators have determined, the processes of laser machining and magnetic annealing may not "commute." That is, to laser machine and then anneal may not yield the same results as annealing, then laser machining. Magnetic annealing tends to make the material stiffer and perhaps somewhat embrittled. Accordingly, in one aspect, the tape format array resonator device may be produced by laser cutting prior to annealing. As such, in one aspect, a process step to "stress relieve" the structure (at about, e.g., 250° C.) may be performed to increase Q and gain rather than performing a full annealing process. Alternatively, another option for higher gain and consistency, would be to perform an annealing process to the material at 250° C., and then apply a heat sink in the hinge area during magnetic annealing of the ribbon to a temperature in the vicinity of 300° C. Such a processing step can be performed in a reel-to-reel annealing process, where the heat sink includes a (chilled) platen and roller, for example.

Figure 3:
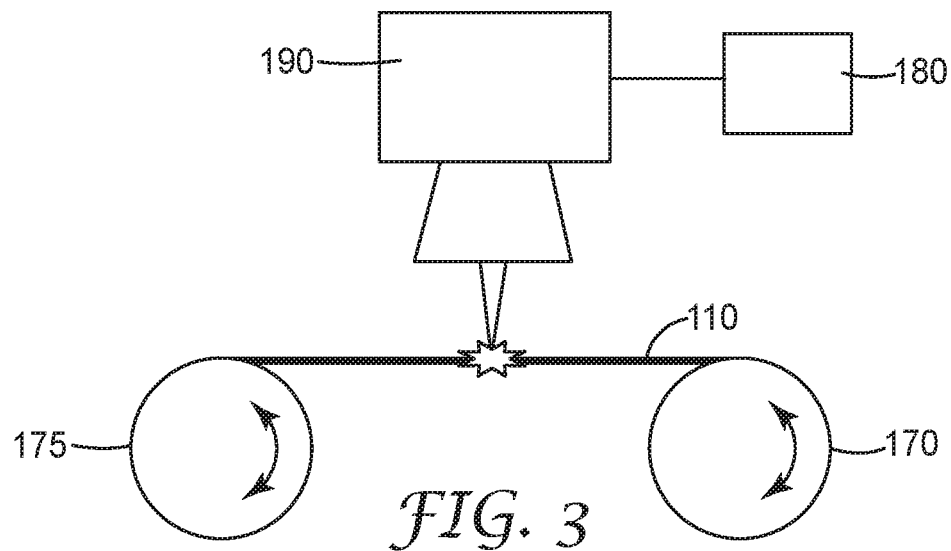
FIG. 3 is a schematic view of a laser machining system for manufacturing a tape format magnetoelastic resonator device according to another aspect of the invention.

The tape format structure of device 100 can allow for the possibility of reel-to-reel manufacturing processes with the possibility of decreased factory cost. One of these processes comprises a laser machining process in which an un-patterned tape 110 pays off a reel-to-reel system and is processed by a laser, and then is wound up on a take up reel. Such a process is depicted in FIG. 3, where a tape or ribbon 110 is provided on a first reel 170, then exposed to a laser 180 that is directed onto the tape 110 and monitored via an optical scanner 190. A take up reel 175 collects the processed ribbon or tape 110. As would be apparent to one of skill in the art given the present description, the machining system of FIG. 3 can include further components to further ensure precision and repeatability.

Figure 4:
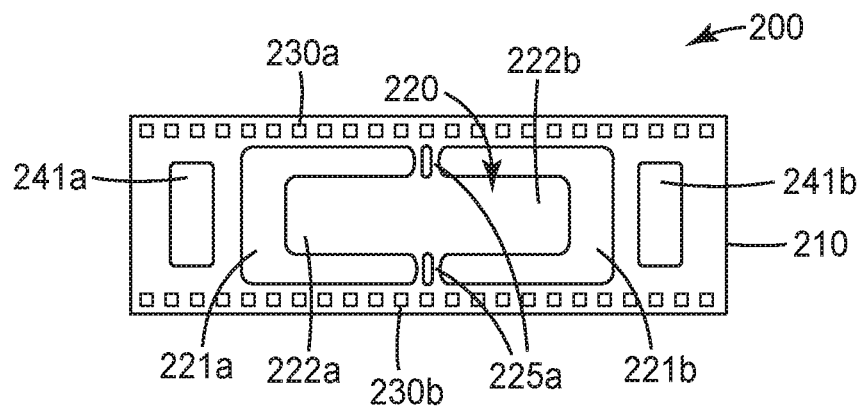
FIG. 4 is top view of a portion of a tape format magnetoelastic resonator device according to another aspect of the invention.

For example, in addition to forming the structure of the resonator, the laser machining process can optionally provide "sprocket holes" for tape transport in the remaining process steps. As shown in FIG. 4, a tape format magnetoelastic resonator device 200 can be formed from a tape or ribbon 210 (comprising, e.g., an amorphous magnetic material, such as is described above). In particular, a first section of the tape 210 includes a first slot 241a configured to receive a first bias magnet (not shown). A second section of the tape 210 is adjacent to the first section along the longitudinal axis and comprises a first magnetoelastic resonator strip 220 having first and second free ends 222a, 222b and a central portion 224a connected to the tape 210 via hinge 225a. The resonator strip is formed by removing portions 221a and 221b, such as by a laser machining process, to form shaped cavities in the ribbon or tape 210. The shape of removed portions 221a and 221b can also be configured to form a particular hinge shape. A third section of the tape 210 is disposed adjacent to the second section along the longitudinal axis and includes a second slot 241b configured to receive a second bias magnet (not shown). As such, resonator strip 220 is disposed between bias magnet slots 241a and 241b. Additional MEL resonator strips can be formed in tape 210 in a manner similar to that described above. In addition, first and second sets of sprocket holes 230a, 230b can be formed in a longitudinal direction along the lateral edges (or "rails") of the tape 210. These sprockets 230a, 230b can allow the tape 210 to be maneuvered through processing equipment in a straightforward manner. The sprocket holes allow for straightforward indexing of the tape, with less use of vision systems and servo systems for tape transport.

Figure 5A:
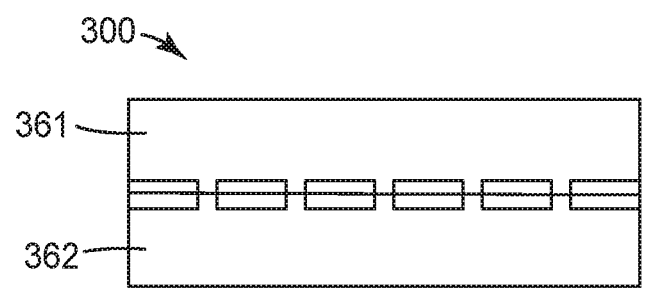
FIGS. 5A and 5B are different schematic cross section views of a magnetoelastic resonator device according to another aspect of the invention.
Figure 5B:
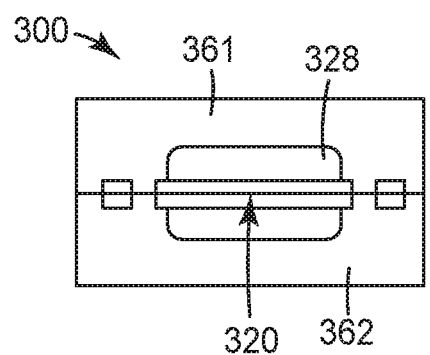

The sprocket hole feature may also be useful in packaging a tape format resonator array, where the amorphous magnetic ribbon 210 is heat sealed between two thermoplastic polymer layers. In this aspect of the invention, the hinge 225a should be sufficiently compliant to allow the resonator to achieve suitable gain. For example, as shown in FIGS. 5A and 5B, a packaged magnetoelastic (MEL) resonator device 300 is shown in cross section view, with FIG. 5A showing a cross section view along the long axis and FIG. 5B showing a cross section view along the short (lateral) axis. Top (361) and bottom (362) covers can provide a "cavity" 228 in the resonator strip 320 area. In this aspect, the bias magnet(s) may be embedded in the covers 361, 362 or reside in the cavity 328. The hinge area would most likely have cavity relief area so as to insure the cover does not itself load the ribbon. The cover would be cast and cured or thermo-formed with the internal cavity, or optionally extruded with the cavity profile. In different aspects, the MEL resonator device 500 can include a single tape (with single or multiple resonators) or device 500 can include a set of stacked tapes (with single or multiple resonators).

If annealing is to be performed after laser machining, then, in one aspect, the process for forming the device can include an in-line process wherein the hinge area of each MEL resonator may be kept at 250° C. or lower by a thermal load (e.g., a heat sink) on the rail of the substrate. A heat sink that operates close to the edge of the ribbon can help insure maximum flexibility of the hinge.

A conventional in-line annealing processes for amorphous ribbon can be used, such as a transverse field annealing process.

Alternatively, if laser machining devices are to be batch annealed, then the process can include winding the ribbon up on a large diameter reel, so that the resonator sections experience a lesser amount of curl. The tape format described herein, however, would provide that free-cut resonators are uncoupled mechanically from the base ribbon and can anneal without imposed tensile stress from the winding on the reel.

In another aspect, multiple layers of the tape format resonator array device can be brought together in an inline process, registered, and "stacked" to form multi-layer resonator arrays that can provide higher gain. Such a resonator stack can include a stack of 2, 3, 4, 5, 6, 7, 8, or more layers of resonator strips, depending on the conditions. When utilizing a sprocket hole construction, such as shown in FIG. 4, then the process of registration can happen readily, as the spatial relationship of the sprocket holes to the resonator is fixed in the design and used in software control of the laser scanning system (see e.g., laser optical scanner system 180, 190 from FIG. 3).

In yet another aspect, a stacked resonator device may further include an additional layer of thin polymer film (2 mils thick, for example) to provide spacing between the stacked resonators. The intermediate polymer film layer can comprise a slit and die cut film, for example, using traditional polymer converting processes. When utilized, this intermediate layer can include a relieved area in the hinge and a solid area in the center nodal point of the resonator.

In addition, the multi-layer stacked array resonator device can be formed using a modified register and laminate process, where each tape format layer is fed from its own payoff reel and aligned using a conventional sprocket drive or other alignment system. The laminated layers can be collected onto a take up reel. The number of payoff reels can be adjusted with a manufacturing setup procedure, according to the design to be produced. If the polymer cover layers or an intermediate polymer film are used, then the inline process can be modified accordingly.

Insertion of the bias magnet(s) can be accomplished using a conventional pick and place process to robotically place the magnets on the stacked films before cover layer lamination or other packaging. Alternatively, an inline reel of material with both an intermediate film and bias magnets pre-fabricated before final assembly can be utilized. In a further alternative, application and curing of a bias magnet material can be utilized, or the bias magnets can be integral with the cover.

In a further alternative, the sealed array can be singulated into "sticks" or "clusters" of resonators, depending on the application at hand. If so, the patterned amorphous magnetic material can be laser machined in such a way as to provide an appropriate "space" where the assembly can be heat sealed or potted, as the laser machining operation can be operated under software control, allowing a variable number of resonators in a "stick" or "cluster."

Figure 6:
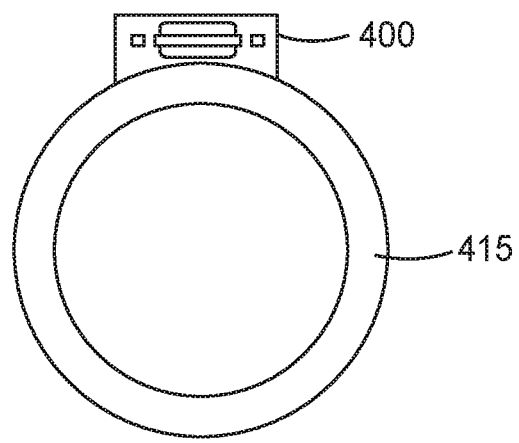
FIG. 6 is a schematic cross section view of a magnetoelastic resonator device attached to a pipe according to another aspect of the invention.

FIG. 6 shows one example of a tape format magnetoelastic resonator in use, as a marker 400, similar to device 300 shown in FIG. 5B, attached to an outer surface of pipe 415, such as a water or natural gas transmission pipe. Attachment of the marker 400 to the pipe 415 can be accomplished via a conventional adhesive or welding technique.

The MEL resonator devices described herein can be disposed on or near an underground asset, such as a pipe, conduit, or other facility. For example, an MEL resonator device, such as device 100, 200, 300, can be a stand-alone marker, it can be physically attached to an underground asset, such as a pipe or other utility, or it can be attached to another device, such as caution or warning tape, located at or near the underground asset. In addition, the MEL marker devices described herein can be utilized in non-underground environments, such as for use in locating and identifying above-ground assets otherwise hidden from view (such as in a container or within a building wall, ceiling, or floor).

Moreover, the MEL marker devices can be specifically designed to operate at different frequencies which are associated with unique asset types such as different utility infrastructure (e.g., water, waste water, electric, telephone/cable/data, and gas). For example, in one aspect, the MEL marker device can have a frequency range of from about 34 kHz to about 80 kHz. It is noted that for some applications, for example, for plastic pipe locating, frequency shifts are not desirable where multiple MEL marker devices may be combined to achieve additional detection depth. Accordingly, the MEL marker devices disclosed herein can be clustered (for additional depth), without demonstrating substantial frequency shifts. In addition, especially for pipe locating applications, the MEL marker devices can be employed to provide not only asset location, but also asset directionality.

In alternative aspects, an MEL marker device can be utilized as part of a sterilization indicator system that provides time, temperature, and/or chemical information. In a further alternative aspect, the MEL marker device can be utilized as part of a perishable (e.g., food spoilage) indicator system that provides time and temperature information. In a further alternative aspect, the MEL marker device can be utilized as part of a leak detection system that provides leak information for above or below ground utilities. For example, in this particular aspect, the MEL marker device can further incorporate an embedded antenna to wirelessly communicate sensor information. Alternatively, the MEL marker device can be designed to be physically affected by changing conditions so that a signal response may vary over time or conditions, indicating certain information to the user.

A portable locating device can be used to detect the MEL marker devices described herein. An exemplary portable locating device is described in US 2012/068823, incorporated by reference herein. Such a locating device can comprise a single antenna that is used to generate an electromagnetic field and to detect a response of the MEL resonator device 100, 200, 300. In an alternative aspect, the portable locating device can comprise multiple antennas, where one antenna could be used for generating an electromagnetic field and a second antenna could be used for detecting the response of the MEL marker to the generated field. The locating device can be battery powered for better portability. An integrated display can provide a user with a variety of information about located markers and the assets that the MEL markers are associated with. For example, the display can provide information about marker and asset depth, direction, or other information about the MEL markers. Exemplary portable locating devices include the 3M™

Dynatel™ 1420 Locator and the 3M™ Dynatel™ 7420 Locator, both distributed by 3M Company of St. Paul, Minn. In one embodiment, the locating device firmware can be programmed so as to tune the locator antenna to radiate a particular, or several particular desired frequencies.

Thus, the MEL marker devices described herein can be utilized in many different identification and location applications. For example, an MEL marker device can be a stand-alone marker, it can be physically attached to an underground asset, such as a pipe or other utility, or it can be attached to another device, such as caution or warning tape, located at or near the underground asset. In addition, the MEL marker devices described herein can be utilized in non-underground environments, such as for use in locating and identifying above-ground assets otherwise hidden from view (such as in a container or within a building wall, ceiling, or floor).

The present invention has now been described with reference to several individual embodiments. The foregoing detailed description has been given for clarity of understanding only. No unnecessary limitations are to be understood or taken from it. It will be apparent to those persons skilled in the art that many changes can be made in the embodiments described without departing from the scope of the invention. Thus, the scope of the present invention should not be limited to the details and structures described herein, but rather by the structures described by the language of the claims, and the equivalents of those structures.

The invention claimed is:

1. A tape format magnetoelastic resonator device, comprising:
 a tape or ribbon formed from an amorphous magnetic material having a longitudinal axis, wherein sprocket holes are formed along the lengthwise edges of the tape,
 wherein a first section of the tape includes a first slot configured to receive a first bias magnet,
 wherein a second section of the tape, adjacent to the first section along the longitudinal axis, comprises a first magnetoelastic resonator strip having first and second free ends and a central portion, the central portion connected to the tape via a hinge, and
 wherein a third section of the tape, adjacent to the second section along the longitudinal axis, includes a second slot configured to receive a second bias magnet.

2. The tape format magnetoelastic resonator device of claim 1, further comprising:
 a fourth section of the tape, adjacent to the third section along the longitudinal axis, comprising a second magnetoelastic resonator strip having first and second free ends and a central portion, the central portion connected to the tape via a hinge, and
 a fifth section of the tape, adjacent to the fourth section along the longitudinal axis, including a third slot configured to receive a third bias magnet.

3. The tape format magnetoelastic resonator device of claim 1,
 wherein the first magnetoelastic resonator strip is configured to couple to an external magnetic field at a particular frequency and convert the magnetic energy into mechanical energy, in the form of oscillations.

4. The tape format magnetoelastic resonator device of claim 1,
 wherein the first magnetoelastic resonator strip is one of substantially rectangular in shape or substantially elliptical in shape.

5. The tape format magnetoelastic resonator device of claim 1 attached to an asset buried underground.

6. The tape format magnetoelastic resonator device of claim 1,
 wherein the hinge is formed as one or more narrow strips extending from the central portion of the resonator strip towards the outer edges of the tape or ribbon.

7. The tape format magnetoelastic resonator device of claim 1,
 wherein the hinge geometry is configured to decrease the effect of loading due to the Poisson contraction.

8. A tape format magnetoelastic resonator device comprising an array of two or more continuous ribbons of amorphous magnetic material having a plurality of separate, hinged magnetoelastic resonator strips formed from each ribbon, linearly displaced along a longitudinal axis of each ribbon, wherein each magnetoelastic resonator strip is configured to couple to an external magnetic field at a particular frequency and convert the magnetic energy into mechanical energy, in the form of oscillations, wherein the array is layered in such a way as to register individual resonators into a stacked resonator arrangement at each location along the array.

9. The tape format magnetoelastic resonator device of claim 1,
 wherein the resonator device has a frequency range of from about 34 kHz to about 80 kHz.

10. The tape format magnetoelastic resonator device of claim 1,
 wherein the resonator device can be detected at a depth up to about 48 inches underground.

11. A magnetoelastic marker system comprising the tape format magnetoelastic resonator device of claim 1 and a portable locating device.

* * * * *